(12) United States Patent
Kliem

(10) Patent No.: US 10,778,217 B2
(45) Date of Patent: Sep. 15, 2020

(54) ELECTRONIC SWITCHING CIRCUIT

(71) Applicant: Thomas Kliem, Rottweil (DE)

(72) Inventor: Thomas Kliem, Rottweil (DE)

(*) Notice: Subject to any disclaimer, the term of this patent is extended or adjusted under 35 U.S.C. 154(b) by 0 days.

(21) Appl. No.: 16/218,553

(22) Filed: Dec. 13, 2018

(65) Prior Publication Data
US 2019/0207605 A1    Jul. 4, 2019

(30) Foreign Application Priority Data

Dec. 30, 2017   (DE) .................. 10 2017 012 069

(51) Int. Cl.
*H03K 17/687* (2006.01)
*H03K 17/0812* (2006.01)
*H03K 17/12* (2006.01)

(52) U.S. Cl.
CPC ... *H03K 17/6871* (2013.01); *H03K 17/08122* (2013.01); *H03K 17/122* (2013.01); *H03K 17/6874* (2013.01); *H03K 2217/0009* (2013.01); *H03K 2217/0081* (2013.01)

(58) Field of Classification Search
CPC ......... H03K 17/6871; H03K 17/08122; H03K 17/122
USPC .................. 327/108, 109, 110, 111, 112
See application file for complete search history.

(56) References Cited

U.S. PATENT DOCUMENTS

| | | | |
|---|---|---|---|
| 6,259,306 B1 | 7/2001 | Brülhart et al. | |
| 8,933,533 B2 * | 1/2015 | Mauder | H03K 17/687 |
| | | | 257/500 |
| 2014/0009189 A1 | 1/2014 | Mauder et al. | |
| 2014/0253535 A1 * | 9/2014 | Lim | G09G 5/008 |
| | | | 345/213 |
| 2017/0040993 A1 | 2/2017 | Janssens | |
| 2017/0201170 A1 * | 7/2017 | Abu-Hajar | H02M 1/12 |
| 2018/0183334 A1 * | 6/2018 | Fomenko | H02H 7/1213 |
| 2018/0204400 A1 * | 7/2018 | Froitzheim | H01Q 1/3241 |

FOREIGN PATENT DOCUMENTS

| | | |
|---|---|---|
| DE | 10002507 A1 | 7/2001 |
| DE | 202009002013 U1 | 7/2009 |
| DE | 102013106798 A1 | 1/2014 |
| DE | 202016104258 U1 | 9/2016 |
| DE | 102015211625 A1 | 12/2016 |
| DE | 102015011396 A1 | 3/2017 |

* cited by examiner

*Primary Examiner* — John W Poos
(74) *Attorney, Agent, or Firm* — Smartpat PLC

(57) ABSTRACT

An electronic switching circuit, in particular a solid state relay, provides bidirectional electronic power switching. The circuit can be connected to a load and an electrical voltage source. It includes two field effect transistors and a control circuit. The control circuit is conductively connected to the respective gate terminal of the field effect transistors. The field effect transistors are connected in an anti-serial configuration.

8 Claims, 5 Drawing Sheets

ELECTRONIC SWITCHING CIRCUIT

TECHNICAL FIELD

The disclosure relates to an electronic switching circuit, in particular to a solid state relay, for bidirectional electronic power switching.

BACKGROUND

It is known to use electromagnetic relays for low-power switching of electric loads. A switched electric load may e.g. be an inductive or a capacitive load, for example in an industrial application or in a motor vehicle. However, electromagnetic relays have the disadvantage that they require a lot of space and switch relatively slowly. Additionally, electromagnetic relays consumer relatively large amounts of electrical power and are prone to failure.

Attempts have been made to avoid these disadvantages by using electronic switches, in particular transistors, instead of electromagnetic relays to shorten switching time and to reduce power consumption. These are the so-called solid state relays. However, known solid state relays have the disadvantage over electromechanical relays that they can switch current in the output circuit only in one direction. Also, input and output circuits are vulnerable to overload and interferences and have higher voltage drops in the output circuit than traditional relay.

Due to the fact that known solid state relay can only switch unidirectionally, it is not possible to use them without paying close attention to the polarity of the circuit in which they are used. Rather, there is a risk that the transistor is destroyed. Also, an improper polarity reversal can lead to damage or destruction of the transistor, especially at relatively high currents.

There is therefore a vital interest in developing solid-state relays which have the same beneficial characteristics as electromechanical relays. So far, this has not been possible. Therefore, electromechanical relays cannot be easily replaced in a variety of applications.

Classic high-power switches such as thyristors or TRIACs are known in the art which are capable of bidirectional switching. However, they have the disadvantage that they cannot be turned off via the gate. Only after a polarity reversal of the switched voltage do they return to a high-impedance state and can be re-triggered. Newer technologies such as GTOs or IGCTs can be turned off through the control gate, but due to their package and relatively high cost they are not practical for a variety of applications.

It is therefore an object of the disclosure to provide an electronic switching circuit, in particular a solid state relay, which can switch comparatively high currents bidirectionally.

SUMMARY

The object is achieved by an electronic switching circuit, in particular a solid state relay, for bidirectional electronic power switching which can be connected to a load and an electrical voltage source. The switching circuit includes two field effect transistors and a control circuit. The control circuit is conductively connected to the respective gate terminals of the field effect transistors. The field effect transistors are connected anti-serially.

Anti-serial refers to a series connection of the field effect transistors (FETs) with opposite polarity. This means that, for example, the source terminal of the first field effect transistor is conductively connected to the source terminal of the second field effect transistor. It is also possible that the drain terminal of the first field effect transistor is connected to the drain terminal of the second field effect transistor. Conductively connected refers to the presence of an electrically conductive connection, e.g. a wire or a trace on a circuit board.

The disclosed electronic switching circuit makes it possible to bidirectionally switch electrical direct current with high current intensity. The switching circuit can be used both as a high-side switch or a low-side switch. I.e., the switching circuit can be used to switch battery or ground to a consumer. The switching circuit is polarity independent. Polarity independent here refers to the fact that the switching circuit can operate irrespective of which of its outputs is connected to power and which to the consumer (when operating as a high-side switch) or which of its outputs is connected to the consumer and which to ground (when operating as a low-side switch).

In principle, all types of field effect transistors can be used in the electronic switching circuit. Among the preferred field effect transistors is the group of insulated-gate field-effect transistors.

In an insulated-gate field-effect transistor (IGFET), an electrically nonconductive layer separates the gate from the so-called channel, the actual semiconductor region in which the transistor current later flows between source and drain. The usual structure of such a transistor consists of a control electrode made of metal, an electrically insulating intermediate layer, and the semiconductor, i.e. a metal-insulator-semiconductor structure. Transistors of the design are therefore called metal-insulator-semiconductor (MISFET). If an oxide is used as the insulator they are referred to as metal-oxide-semiconductor field effect transistor (MOSFET).

The current flow in the channel is controlled by the electrical potential at the gate, more precisely the voltage between gate and body. The use of IGFETs is particularly preferred. Preferably, the body is internally connected to the source. In this case, the control takes place via the voltage between gate and source. Preferably, the IGFET includes a body diode. Due to the body diode IGFETs are generally bidirectional. As a result, it is not possible to block a current in both directions by a single IGFET. Only by the anti-serial arrangement of the transistors, a bidirectional relay is created. If both transistors are shut off, the current flow is blocked in both current directions. On the other hand, if they are both open, current can flow bidirectionally across the respective source-drain channel.

In principle, JFETs can also be used. These have the advantage that they do not have a body diode. They are therefore blocking in both directions.

N-channel FETs and/or p-channel FETs can be used. Both types may be of the enhancement mode or of the depletion mode. Preferably, the n-channel FETs and/or the p-channel FETs are of the enhancement mode. The enhancement mode is self-blocking (normally open). This means, that the gate-source voltage (control voltage) must first exceed a threshold voltage in order to form a conductive channel. No conductive channel is formed on the source-drain path when the gate is not driven. This ensures that, for example, in the event of a defect in the control circuit of the gate, the flow of current is interrupted. The threshold voltage for self-blocking p-channel IGFETs is <0 V. If the output is switched to ground, this voltage difference can no longer be generated by the gate/source reference. The IGFET which is wired as a low-side driver would be pinched off. A negative voltage is therefore required for control. Negative voltage here refers to a voltage which is smaller than the reference potential. The reference potential is preferably provided by an internal ground. The reference potential is preferably assigned the value 0. For this purpose, the control circuit preferably includes a negative voltage regulator. Self-blocking (normally open) p-channel IGFETs are preferred. These have the advantage that they can be switched on and off by disconnecting or connecting ground. Furthermore, p-channel IGFETs are controllable with a comparatively low negative control voltage.

Alternatively, the switching circuit can also be realized by self-blocking (normally open) n-channel IGFETs. This is particularly preferred in the case where the applied supply voltage exceeds 50V. It is preferred here for the control circuit to include at least one charge pump. Thereby, an effective control of the gate is ensured. This is required because the control voltage must exceed the supply voltage to effect control of the gate and form an n-channel.

Within the switching circuit the field effect transistors are connected in an anti-serial manner. This means that, for example, the source terminal of the first field effect transistor is conductively connected to the source terminal of the second field effect transistor. It is also possible that the drain terminal of the first field effect transistor is connected to the drain terminal of the second field effect transistor. Which arrangement to use depends on the choice of FETs. If the FETs are self-blocking (normally open) p-channel IGFETs, a source-source connection is preferred. In contrast, if n-channel IGFETs are used, a drain-drain connection is preferred. In each case, the natural direction of the respective p or n channel is utilized.

In case of a source-source connection of the p-channel IGFETs, each of the two IGFETs is respectively arranged in the reverse direction of the body diode of the other IGFETs. In the case where both IGFETs are closed and in the "off" state, current may flow across the body diode of one IGFET depending on the polarity, but not across the second IGFET, which is wired such that its body diode in this case is in reverse. Thereby, a bidirectional switch is realized. Now, when an IGFET is driven, current flows through the body diode of the first IGFET in the forward direction and across the p-channel of the second IGFET. In the case of a drain-drain connection, the order is reversed. As a result, a bidirectional solid state relay can be realized with comparatively few electronic components.

According to a preferred embodiment, the two FETs are each connected in parallel with a diode. Although operation via the body diode is generally practicable, this concept has the disadvantage that higher power dissipation can arise through the body diode. Furthermore, there is a risk, especially at higher currents, that the body diode and/or the FET as a whole will be overloaded and thereby destroyed. By the parallel connection of an additional diode, the current bypasses the FET having the body diode which is in forward direction at a given polarity. It is preferred, that the two diodes are also connected in anti-series. It is further preferred that the respective diode is connected in such a way that it's respective forward and reverse direction corresponds to that of the body diode of the parallel-connected FET. As a result, an improved solid state relay is realized.

According to a preferred embodiment, the switching circuit is a component of a solid state relay assembly. The solid state relay preferably has electrical connections, in particular in the form of terminals, with which the switching circuit can be connected to a supply voltage. It is generally possible to obtain the control voltage, in the case of p-channel IGFETs in particular a negative control voltage between −5 V and −10 V relative to the internal reference potential, from a separate voltage source independent of the supply voltage source. However, it is preferred to obtain the control voltage from the supply voltage source.

According to a preferred embodiment, the control circuit may include a rectifier for this purpose. Preferably, the rectifier can be connected via an input switch to the positive pole of the supply voltage source and/or via a switch, in particular a circuit breaker, connected to the negative pole of the supply voltage source. As a result, the switching circuit requires a much lower operating current than electromechanical relays. If the supply voltage is supplied by a battery, this considerably increases the discharge time of the battery. If the solid state relay is used as a battery disconnect relay, the battery remains permanently on.

Use of always-on electromechanical relays can lead to the battery of a vehicle being discharged after a short time. This was a major problem, especially in trucks or buses, because their batteries were no longer operational after a short downtime. Furthermore, this preferred embodiment advantageously makes both the supply circuit and the control circuit bidirectional.

The solid state relay realized thereby can consequently be operated without risk of damage or a subsequent defect by switching the input switch off or on in positive circuit and/or by removing or connecting the ground. Furthermore, it is completely insensitive to reverse polarity in the sense of a wrong polarity and can also be operated with opposite polarity. It is therefore possible to operate a consumer in a switched power or switched ground configuration in any desired polarity.

According to a preferred embodiment, the rectifier has an overvoltage protection. Preferably, the overvoltage protection is formed by a varistor. This is a voltage-dependent resistor, the electrical resistance of which sharply decreases with increasing voltage at constant temperature. Alternatively, the overvoltage protection can be designed as a suppressor diode.

According to a preferred embodiment, the control circuit includes control electronics. The control electronics are preferably connected in series between the rectifier and the gates of the FETs. The reason for this is that, in particular, an n-channel IGFET requires a high drive voltage of at least 10 volts at the gate. At a voltage below this limit, the field effect transistor enters into analog operation, which brings with it the risk of overloading. To prevent this, the control electronics is provided which forcibly shuts off the module with the FET as undervoltage protection. Preferably, the control electronics has a delay element. As a result, in particular the charging time of the coil of an electromechanical relay can be simulated. Preferably, the delay element is designed as a hysteresis circuit. Particularly preferably, the hysteresis circuit is formed by a Schmitt trigger. Thereby, discrete switching thresholds can be specified with reference to the voltage. Preferably, at a nominal voltage of 12V the switching thresholds are at >9V (on) and at <2V (off). At a nominal voltage of 24V the switching thresholds are >18V (on) and <3V (off). Since the thresholds are not proportional to the supply voltage, the Schmitt trigger has the advantage of being able to independently set the switching thresholds.

The delay is moreover preferred so that, if the control voltage is derived from the supply voltage, the charge pump or the negative voltage regulator have enough time to build up the voltage. Otherwise there is the possibility that the FETs are operated too long in unwanted analog mode.

According to a preferred feature, the entire assembly is embedded in a housing made of a thermally conductive potting compound, which supports the heat dissipation of the semiconductor elements to the housing wall.

The housing may have a rectangular bottom plate with plug-in contact elements, which are keyed and compatible with standardized electromagnetic plug-in relays. Thus, an electromagnetic relay can easily be exchanged for a solid state relay.

In order to reduce the internal resistance of the field effect transistors and thereby minimize the power loss in the electronic components, a plurality of field effect transistors in the solid state relay can be connected in parallel, for example up to five FETs. This also has the advantage, that the power of the solid state relay can be adapted to high currents. The preferred parallel connection enables bidirectional switching of currents above 70 A.

According to a further feature of the invention, the FETs have overvoltage protection. This is preferably formed by a suppressor diode, which is connected in parallel with the anti-serial FETs. Alternatively, the overvoltage protection can also be realized by a varistor or a similar component.

According to a further feature, the gate terminals have overvoltage protection. Particularly in the case of p-channel IGFETs, control voltage and supply voltage are present at the gate. As a result, the maximum allowable gate voltage can be exceeded. The overvoltage protection is realized by a diode which limits the voltage in case of an overvoltage. Preferably, the diode is formed as a Zener diode.

The disclosure further relates to the use of an electronic switching circuit, in particular a solid state relay, in particular in a motor vehicle, in particular for the bidirectional switching of DC electrical current of 1 A to 1000 A, preferably from 40 A to 1000 A, preferably 70 A to 1000 A, and more preferably 70 to 500 A.

The disclosure further relates to the use of an electronic switching circuit, in particular a solid state relay, as a separation relay, opening relay or change-over relay. The relays can be integrated in all types of circuits in working and/or power machines. They are preferably used in vehicles, in particular motor vehicles.

BRIEF DESCRIPTION OF THE DRAWINGS

The invention may be more completely understood in consideration of the following detailed description of various embodiments of the invention in connection with the accompanying drawings, in which.

DETAILED DESCRIPTION

FIGS. 1 to 4 each show a circuit diagram of a solid state relay with an assembly comprising a control circuit L1, which is connected via terminals 15 and 31 to a supply voltage, for example a battery. The positive pole of the battery +UBATT is connected via an input switch S1 to the control circuit L1, while the negative pole −UBATT is connected via a second switch S2 to the terminal 31 of the control circuit L1.

Figure 1:
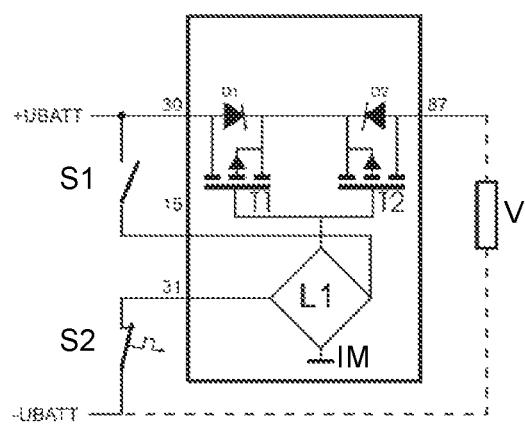
FIG. 1 is a circuit diagram of an electronic switching circuit in a ground circuit.
Figure 2:
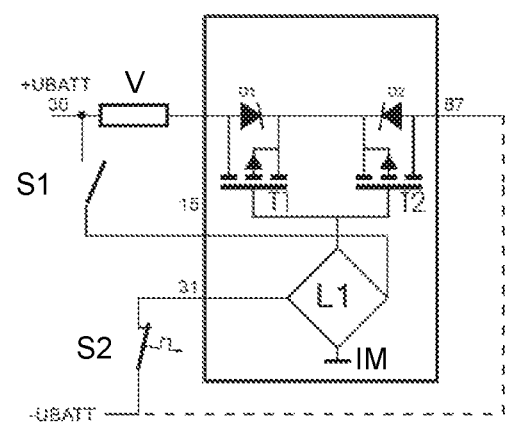
FIG. 2 is a circuit diagram of an electronic switching circuit according in a plus circuit.

While an output of the control circuit L1 is connected to an internal ground IM, a second output leads to the gates of the field effect transistors T1, T2, which, as shown in FIGS. 1 to 4, are provided as self-blocking (normally open) power p-channel IGFETs, in particular power p-channel MOSFETs. A third output leads via the switch S2 to the negative pole −UBATT As illustrated in FIGS. 1 and 2, the field effect transistors T1, T2 are connected in anti-series. The anti-serial circuit is designed such that the drain of the first field effect transistor T1 leads via the terminal 30 to the positive pole +UBATT. The source of the first field effect transistor T1 is conductively connected to the source of the second field effect transistor T2. The drain of the second field effect transistor T2 leads via the terminal 87 to the negative pole −UBATT.

Figure 3:
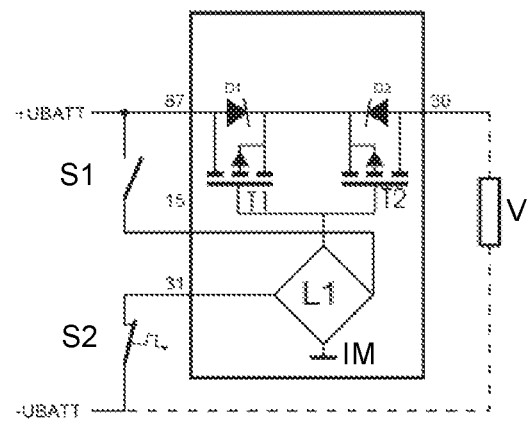
FIG. 3 shows a circuit diagram of an electronic switching circuit in a ground circuit with opposite polarity.
Figure 4:
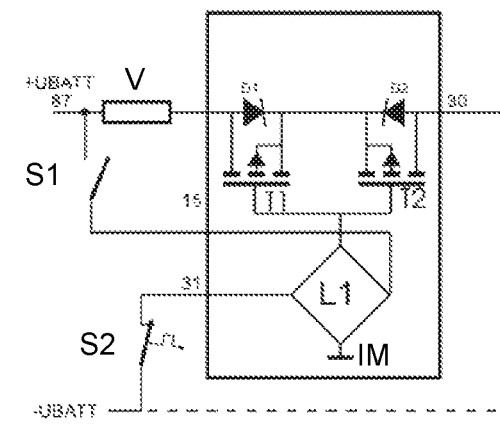
FIG. 4 is a circuit diagram of an electronic switching circuit in a plus circuit with opposite polarity.

In contrast, FIGS. 3 and 4 show an opposite polarity. Again, the field effect transistors T1, T2 are connected in anti-series. The anti-serial circuit is designed such that the drain of the first field effect transistor T1 leads via the terminal 87 to the positive pole +UBATT. The source of the first field effect transistor T1 is conductively connected to the source of the second field effect transistor T2. The drain of the second field effect transistor T2 leads via the terminal 30 to the negative pole −UBATT.

FIGS. 1 to 4 also show the respective body diodes D1, D2 of the field effect transistors T1, T2.

Overall, therefore, a load circuit between the terminals 30 and 87 and a control circuit between the terminals 15 and 31 is defined.

As shown in FIGS. 1 and 3, a consumer V can be switched to ground. Likewise, it is possible to switch a load in plus circuit, as shown in FIGS. 2 and 4.

Figure 5:
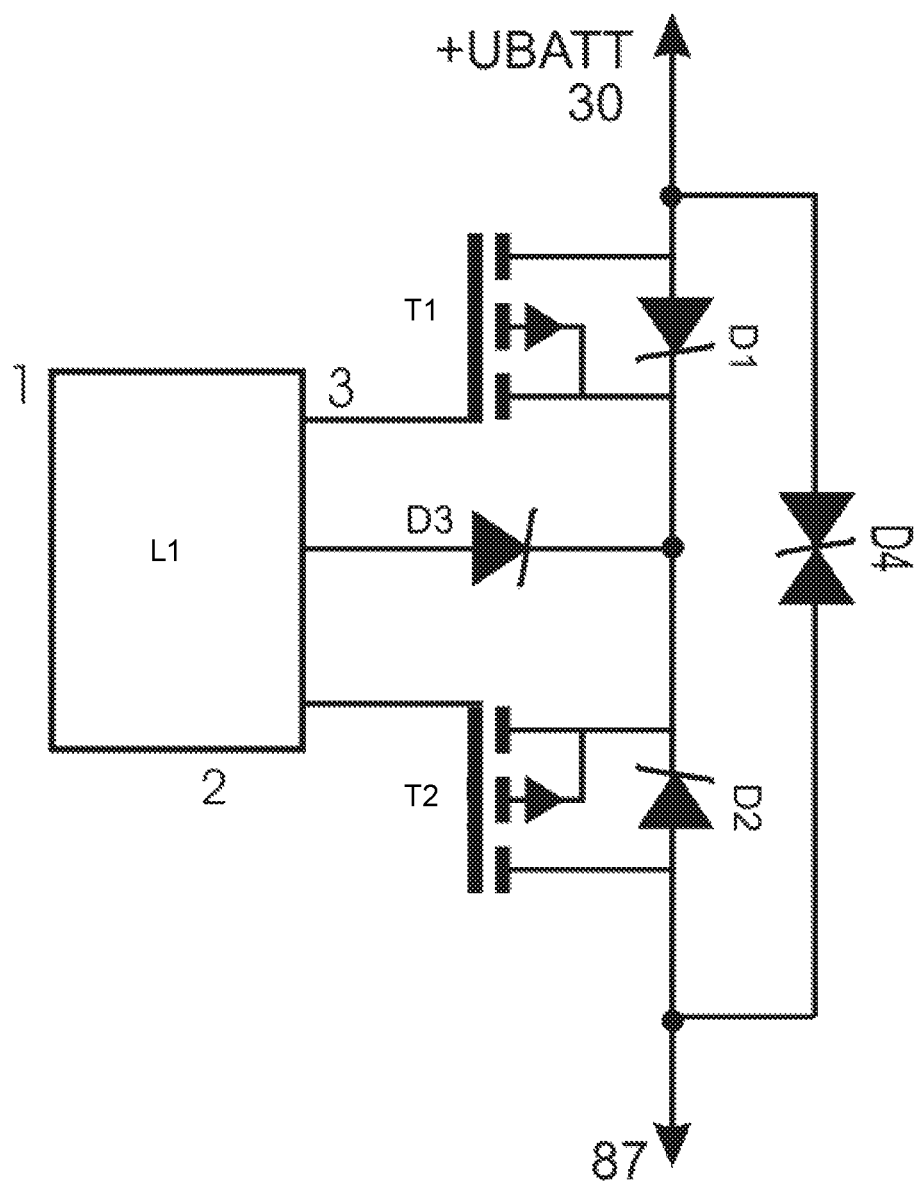
FIG. 5 is a detailed partial view of the switching circuit as in FIGS. 1 to 4 with overvoltage protection.

FIG. 5 shows a detail of the circuit diagrams of FIGS. 1 to 4 with an additional suppressor diode D4 and a Zener diode D3. The suppressor diode D4 is connected in parallel to the field effect transistors T1, T2 and to the diodes D1, D2. The Zener diode D3 connects the control circuit L1 to the source-source connection of the field effect transistors T1, T2. As a result, a comprehensive overvoltage protection is realized.

Figure 6:
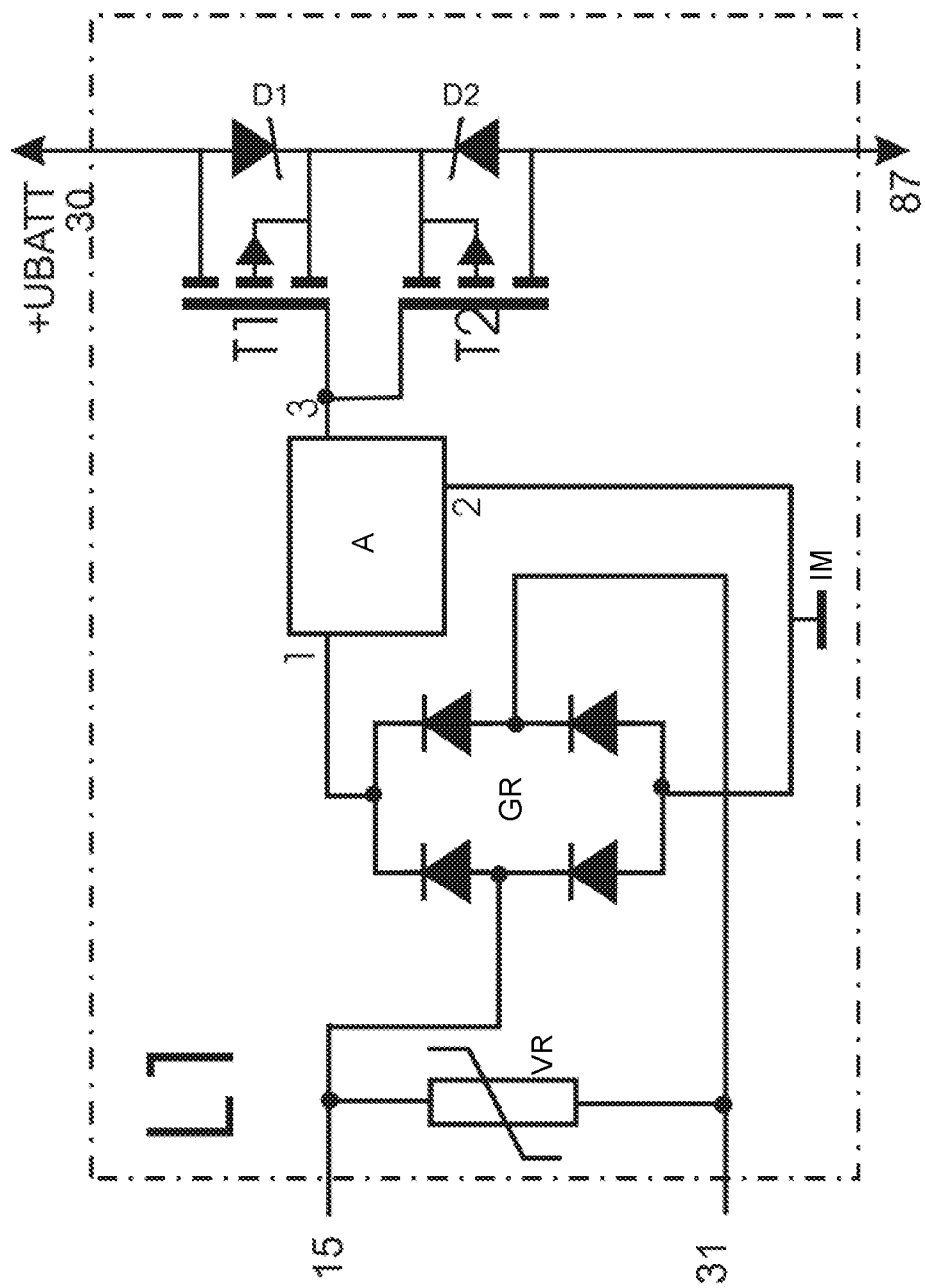
FIG. 6 is a circuit diagram of a control circuit.
Figure 11:
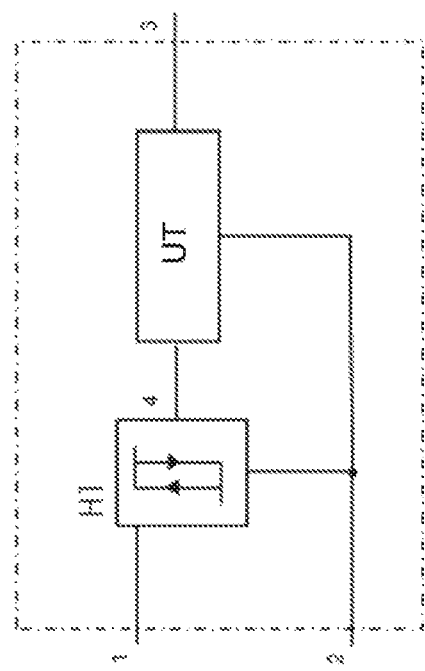
FIG. 11 shows a detail of control electronics.

FIG. 6 shows a circuit diagram of the control circuit L1. The control circuit has a rectifier GR, an overvoltage protection in the form of a varistor VR and control electronics A. The control electronics are connected in series between the rectifier and the gates. The control electronics has a hysteresis circuit in the form of a Schmitt trigger (FIG. 11). The control circuit L1 is particularly preferred when the solid state relay is used as a separation relay.

The solid state relay is thus completely bidirectional. A consumer can be switched with the solid state relay in plus circuit and in ground circuit, i.e. in a switched ground or a switched power configuration. In addition, the solid-state relay is absolutely protected against reverse polarity.

Figure 7:
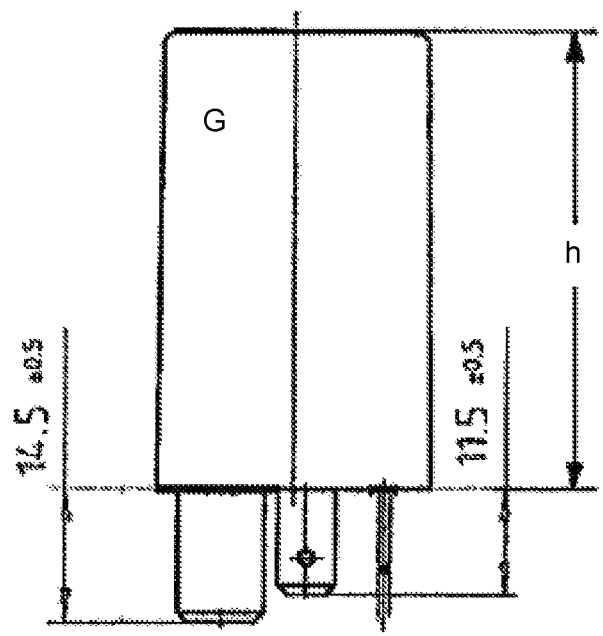
FIG. 7 is a side view of a housing of a solid state relay.
Figure 8:
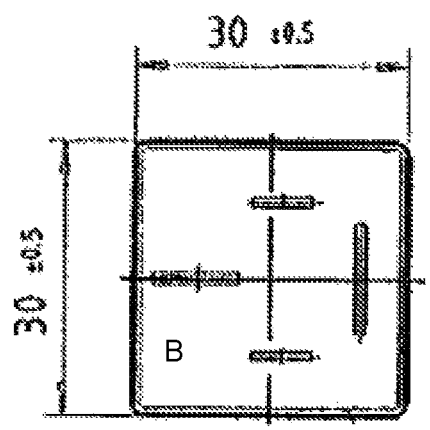
FIG. 8 is a bottom view of the solid state relay as in FIG. 7.
Figure 9:
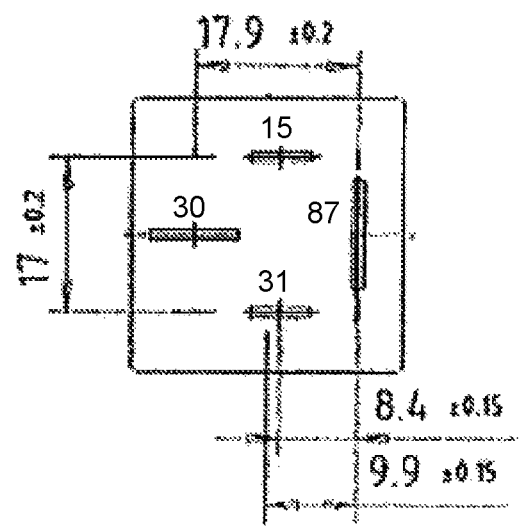
FIG. 9 shows a connector image according to FIG. 7.

FIGS. 7 and 8 show a housing G (height h=40 mm) with a square bottom plate B, in which the entire assembly is embedded by a heat-conductive potting compound. Standardized plug-in contact elements (DIN 46 244 A) extend from the bottom plate B. FIG. 9 shows a connector pinout thereof. This connector pinout is compatible with standardized electromagnetic plug-in relays, so that a problem-free replacement is possible.

The plug contact elements (pins) for the two terminals 30 and 87 have according to DIN 46 244 A the dimensions 9.5×1.2 mm, those for the two terminals 15 and 31, the size of 6.3×0.8 mm. Further, then versions 2.8×0.8 mm could be possible.

Other housing dimensions may be used, especially those with 30 or 40 mm height or bottom plates with 6.3 mm or 2.8 mm contacts.

Figure 10:
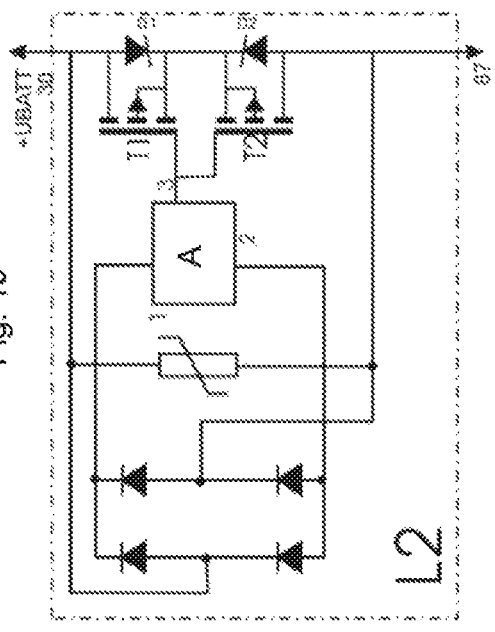
FIG. 10 shows an alternative control circuit.

FIG. 10 shows an alternative control circuit L2. This is particularly advantageous when the solid state relay is used as an opening relay or as a change-over relay.

In this case, the DC regulator GR is not connected to terminals 15 and 31. Instead, the DC regulator is connected to the terminals of supply circuits 30 and 87. The DC regulator GR is also connected in series with the control electronics A.

The control circuit L2 has overvoltage protection in the form of a varistor. Alternatively, the overvoltage protection can also be designed as a suppressor diode.

Figure 12:
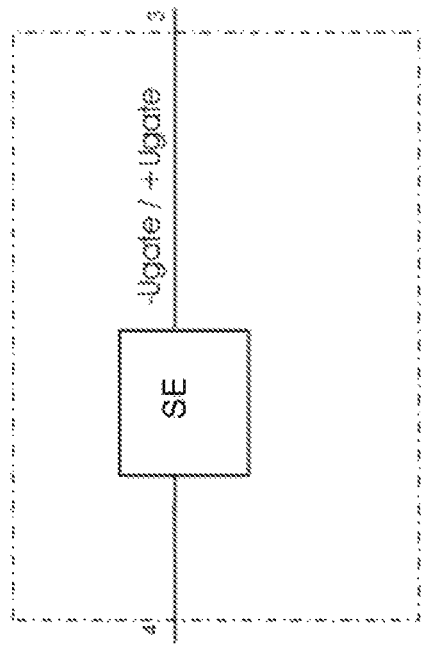
FIG. 12 shows a detail of a voltage generator.

The control electronics A is shown in detail in FIGS. 11 and 12. Its configuration is the same in both control circuits L1, L2. The control electronics A has a hysteresis circuit H1 in the form of a Schmitt trigger. The Schmitt trigger is conductively connected in series with a transmitter UT.

The embodiment of the transmitter UT is shown in FIG. 12. It includes a voltage generator SE, which supplies a positive or a negative control voltage +Ugate/−Ugate depending on the field effect transistors used. If, as in the present example, self-blocking p-channel IGFETs T1, T2 are used, the voltage generator is formed as a negative voltage regulator. This may in particular be a DC-DC converter or a series regulator. The series regulator can be realized in particular as a voltage inverter or with a switching regulator. Alternatively, if self-blocking n-channel IGFETs are used, the voltage generator is designed as at least one charge pump.

What is claimed is:

1. An electronic switching circuit for bidirectional electronic switching of power which can be connected in series between a consumer and
    a direct current electrical voltage source, comprising:
    two field effect transistors connected to one another in an anti-serial configuration; and
    a control circuit which is conductively connected to respective gate terminals of the two field effect transistors,
    wherein the control circuit comprises a negative voltage regulator.

2. The electronic switching circuit according to claim 1, wherein the two field effect transistors are p-channel IGFETs.

3. The electronic switching circuit according to claim 2, wherein the p-channel IGFETs are self-blocking.

4. The electronic switching circuit according to claim 3, wherein the field effect transistors are power IGFETs.

5. The electronic switching circuit according to claim 1, wherein source connections of the two field effect transistors are conductively connected to one another.

6. The electronic switching circuit according to claim 1, wherein the control circuit comprises a Schmitt Trigger.

7. The electronic switching circuit according to claim 1, wherein the control circuit comprises a rectifier.

8. The electronic switching circuit according to claim 1, further comprising at least two further field effect transistors, one of the at least two further field effect transistors being arranged in parallel with each of the two field effect transistors.

* * * * *